(12) United States Patent
Morimoto

(10) Patent No.: US 9,482,452 B2
(45) Date of Patent: Nov. 1, 2016

(54) THERMOELECTRIC MODULE

(71) Applicant: Aisin Seiki Kabushiki Kaisha, Kariya-shi (JP)

(72) Inventor: Akihiro Morimoto, Toyota (JP)

(73) Assignee: AISIN SEIKI KABUSHIKI KAISHA, Kariya-shi (JP)

( * ) Notice: Subject to any disclaimer, the term of this patent is extended or adjusted under 35 U.S.C. 154(b) by 75 days.

(21) Appl. No.: 14/028,924

(22) Filed: Sep. 17, 2013

(65) Prior Publication Data

US 2014/0075961 A1 Mar. 20, 2014

(30) Foreign Application Priority Data

Sep. 19, 2012 (JP) .................. 2012-205379

(51) Int. Cl.
| | |
|---|---|
| H01L 35/30 | (2006.01) |
| F25B 21/02 | (2006.01) |
| H01L 23/544 | (2006.01) |
| H01L 35/08 | (2006.01) |
| H01L 35/32 | (2006.01) |
| H01L 35/34 | (2006.01) |
| H01L 23/38 | (2006.01) |

(52) U.S. Cl.
CPC ............. *F25B 21/02* (2013.01); *H01L 23/544* (2013.01); *H01L 35/08* (2013.01); *H01L 35/32* (2013.01); *H01L 35/34* (2013.01); *H01L 23/38* (2013.01); *H01L 2223/5442* (2013.01); *H01L 2223/54426* (2013.01); *H01L 2223/54486* (2013.01); *H01L 2924/0002* (2013.01)

(58) Field of Classification Search
CPC .................. H01L 27/16; H01L 35/00–35/34; F25B 21/02–21/04

USPC .................................................. 136/243–265
See application file for complete search history.

(56) References Cited

U.S. PATENT DOCUMENTS

| | | | | |
|---|---|---|---|---|
| 5,282,111 | A * | 1/1994 | Hopfer | 361/704 |
| 2005/0172991 | A1* | 8/2005 | Arai et al. | 136/205 |
| 2006/0266402 | A1* | 11/2006 | Zhang et al. | 136/205 |
| 2007/0157628 | A1* | 7/2007 | Onoue | 62/3.2 |
| 2012/0133435 | A1 | 5/2012 | Kumagaya | |

FOREIGN PATENT DOCUMENTS

| | | |
|---|---|---|
| JP | 9-55541 | 2/1997 |
| JP | 2000-353829 A | 12/2000 |
| JP | 2002-299701 A | 10/2002 |
| JP | 2003-051624 A | 2/2003 |
| JP | 2006-305400 | 11/2006 |
| JP | 2008-053301 A | 3/2008 |
| JP | 2013-149738 A | 8/2013 |

OTHER PUBLICATIONS

Office Action issued Jun. 28, 2016 in Japanese Patent Application No. 2012-205379 (with partial English Translation).

* cited by examiner

Primary Examiner — Bach Dinh
(74) Attorney, Agent, or Firm — Oblon, McClelland, Maier & Neustadt, L.L.P.

(57) ABSTRACT

A thermoelectric module includes an insulating substrate, plural electrodes formed on a component side of the insulating substrate, plural peltier elements each mounted on and electrically connected to the electrodes, and a mark for image recognition formed at least one of the electrodes, the mark for image recognition having lightness and/or saturation which is different from lightness and/or saturation of the electrode on an image. An entire of the electrode is usable as an electrical conduction path.

5 Claims, 9 Drawing Sheets

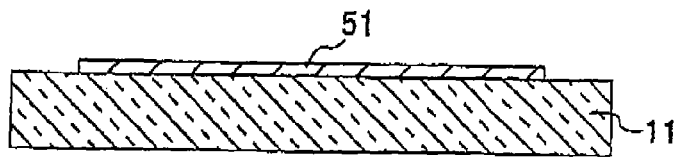
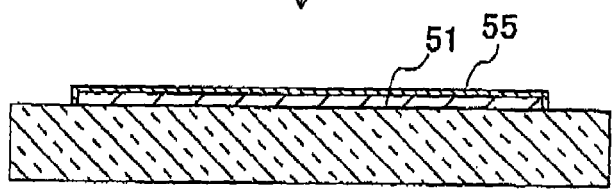
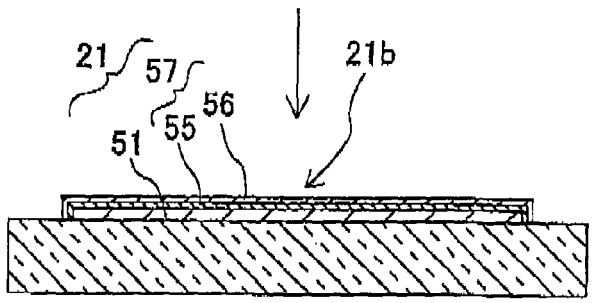
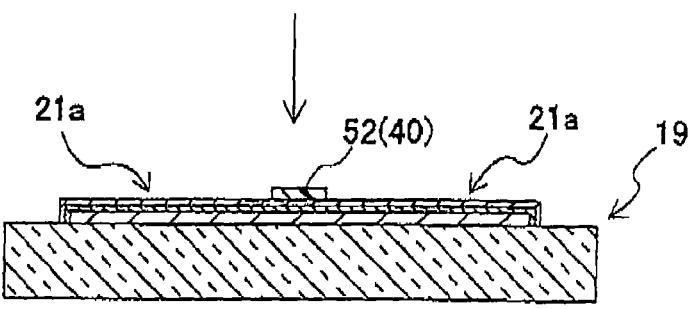
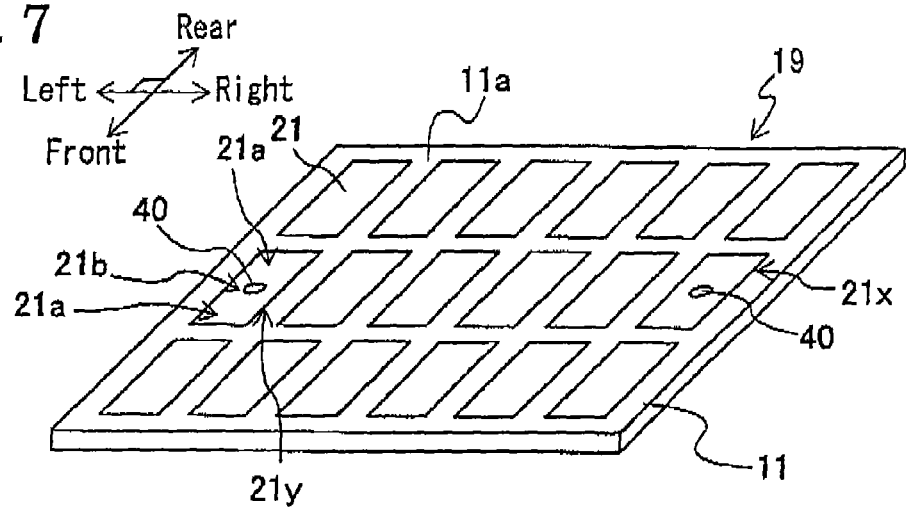

THERMOELECTRIC MODULE

CROSS REFERENCE TO RELATED APPLICATIONS

This application is based on and claims priority under 35 U.S.C. §119 to Japanese Patent Application 2012-205379, filed on Sep. 19, 2012, the entire content of which is incorporated herein by reference.

TECHNICAL FIELD

This disclosure generally relates to a thermoelectric module.

BACKGROUND DISCUSSION

A known thermoelectric module, which uses Peltier effect, includes plural peltier elements and receives supplies of electric power to cool and/or heat various devices (e.g., disclosed in JPH09-55541, i.e., hereinafter referred to as Patent reference 1). The thermoelectric module of this kind is applied for regulating the temperature of an optical communication device, for example, more particularly, a laser diode for optical fiber. In response to an increase of data communication quantity in accordance with changes in communication environment, greater number of thermoelectric modules is requested to be provided. Further, in order to provide greater number of the thermoelectric modules while avoiding an increase of the optical communication device in size, downsizing of components of the thermoelectric module is requested.

The thermoelectric module includes insulating substrates and plural thermoelectric conversion elements (peltier element) mounted onto the insulating substrates. Thus, when manufacturing the thermoelectric module, processes for forming plural electrodes on the insulating substrates and for mounting the peltier elements on the electrodes are required. In view of enhancing manufacturing efficiency, or productivity for manufacturing the thermoelectric modules, it is favorable that the process for mounting the peltier elements on the electrodes is automatically conducted by a mounter, a mounting device. In order to automatically mount the peltier elements on the electrodes, positions of the electrodes on the insulating substrates need to be accurately recognized.

In order to accurately recognize the position of the electrodes on the insulating substrates, for example, the insulating substrate on which the electrodes are formed may be recognized as images, the positional relationship of the plural electrodes, or the positional relationship of the plural electrodes relative to the entire insulating substrate may be obtained, and further, the positions of the electrodes may be obtained.

It is considered to provide a difference in lightness (brightness, value) or saturation (chrome) of plural objects to be recognized in order to perform the image recognition of the insulating substrate on which the electrodes are formed with high precision. However, because the difference in the lightness or the saturation of the insulating substrate and the electrodes is relatively small, it is difficult to recognize the position of the electrodes on the insulating substrate with high precision while recognizing the electrodes which are on the insulating substrate as images, that is, it is difficult to recognize the position of the electrodes on the insulating substrate with high precision while recognizing the electrodes with a background of the insulating substrate as images. It is considered that the position of the electrodes on the insulating substrate can be accurately, or substantially accurately recognized by performing the image recognition with a construction that a mark (mark for image recognition) whose lightness (brightness, value) and/or saturation (chroma) for image recognition differ from those of the insulating substrate.

In those circumstances, as described above, because there is needs for the downsizing of the components of the thermoelectric module, there is no room for arranging a mark for image recognition on the insulating substrate between adjacent electrodes. Thus, the mark for image recognition needs to be formed at the electrode. Patent reference 1 discloses a technology in which a slit is provided at a center portion of the electrode and at a peripheral portion of the electrode. In Patent reference 1, the slit is provided to eliminate the air forming the void at a solder joint portion between the electrode and the thermoelectric conversion element. However, according to the electrode disclosed in Patent reference 1, it is considered that the slit per se functions as a mark for image recognition because of the shade projected in the slit, which enhances the precision for the image recognition explained above.

On the other hand, according to the electrode disclosed in Patent reference 1, because the slit is provided, it is impossible to use the entire electrode as a conduction path. For example, considering the precision, or accuracy of the image recognition, it is favorable that the dimension of the mark for the image recognition is equal to or longer than 0.2 millimeters, whereas a width of an electrode, generally, is equal to or shorter than 0.4 millimeters at the thermoelectric module for an optical communication device. Thus, in case of providing a mark for image recognition on the electrode, the width of the electrode available for the electric conduction is possibly assumed to be equal to or less than a half of the entire width of the electrode. The electrode with the foregoing construction is inferior in conductivity and may hinder the performance of the thermoelectric module from enhancing. Further, according to the electrode with the foregoing construction, electrical resistance is increased at an upstream portion of the conduction path of the slit. Accordingly, the enhancement of the performance of the thermoelectric module may be hindered due to the heat loss at the electrode.

A need thus exists for a thermoelectric module which is not susceptible to the drawback mentioned above.

SUMMARY

In light of the foregoing, the disclosure provides a thermoelectric module, which includes an insulating substrate, a plurality of electrodes formed on a component side of the insulating substrate, a plurality of peltier elements each mounted on and electrically connected to the electrodes, and a mark for image recognition formed at least one of the electrodes, the mark for image recognition having lightness and/or saturation which is different from lightness and/or saturation of the electrode on an image. An entire of the electrode is usable as an electrical conduction path.

According to another aspect of the disclosure, a thermoelectric module includes an insulating substrate including a component side, a plurality of electrodes formed on the component side of the insulating substrate, and a plurality of peltier elements each mounted on and electrically connected to the electrodes. The component side of the insulating substrate includes a conduction path region in which an electrical conduction path including the plurality of peltier elements and the plurality of electrodes are formed, and a general region of the insulating substrate which is a portion other than the conduction path region. The general region of the insulating substrate is formed with a plurality of marks for image recognition whose lightness and/or saturation is different from lightness and/or saturation of the insulating substrate on an image.

BRIEF DESCRIPTION OF THE DRAWINGS

The foregoing and additional features and characteristics of this disclosure will become more apparent from the following detailed description considered with the reference to the accompanying drawings, wherein:

FIG. 6A is an explanatory view schematically showing a procedure for manufacturing a thermoelectric module according to a second embodiment disclosed here;

FIG. 6B is an explanatory view schematically showing a procedure for manufacturing the thermoelectric module according to the second embodiment disclosed here;

FIG. 6C is an explanatory view schematically showing a procedure for manufacturing the thermoelectric module according to the second embodiment disclosed here;

FIG. 6D is an explanatory view schematically showing a procedure for manufacturing the thermoelectric module according to the second embodiment disclosed here;

FIG. 7 is an explanatory view schematically showing a procedure for manufacturing the thermoelectric module according to the second embodiment disclosed here;

DETAILED DESCRIPTION

Figure 1:
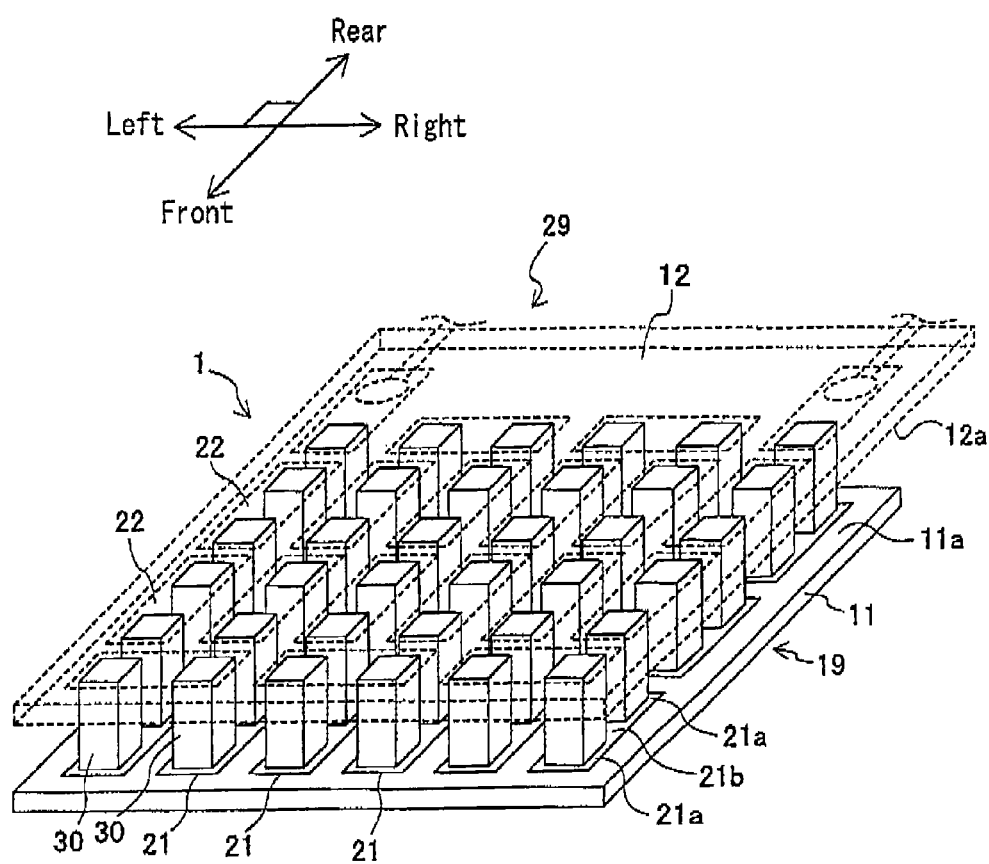
FIG. 1 is a perspective view schematically illustrating a thermoelectric module according to a first embodiment disclosed here.

Embodiments of a thermoelectric module will be explained with reference to illustrations of drawing figures as follows.

The thermoelectric module of the disclosure includes plural electrodes and plural peltier elements. The number of the electrodes and the peltier elements is not particularly limited. Similarly to a general thermoelectric module which includes peltier elements, at least a P-type thermoelectric element and a N-type thermoelectric element, which serves as a pair, may be electrically connected in series or in parallel by means of the electrode. It is favorable to sandwich the plural peltier elements and the electrodes by means of two insulating substrates similarly to the general thermoelectric module. In those circumstances, plural electrodes (first electrode) are formed on one of the insulating substrates (first insulating substrate), a mark for image recognition (first mark for image recognition) is formed on the first electrode and/or the first insulating substrate, and an image of a unit (first unit) of the first electrode and the first insulating substrate including the mark for image recognition is recognized to recognize the position of the first electrode, thus to mount the peltier element onto the first electrode. The peltier element can be mounted onto the electrode by means of a known method, for example, soldering. Similarly, plural electrodes (second electrode) are formed on the other insulating substrate (second insulating substrate), a mark for image recognition (second mark for image recognition) is formed on the second electrode and/or the second insulating substrate, and an image of a unit (second unit) of the second electrode and the second insulating substrate including the second mark for image recognition is recognized to recognize the position of the second electrode, thus to mount the peltier element provided on the first unit onto the second electrode.

Known image recognition methods are applicable. For example, an image of the first unit or the second unit may be captured by an image-capturing element, for example, CCD (charge coupled device) or CMOS (complementary metal oxide semiconductor). Then, the image data obtained by the image capturing element is processed (image processed) to attain the positional data of the mark for the image recognition, thus to recognize the position of the electrode on the basis of the positional data. In case of pattern printing the electrodes, for example, a relative position of each of the electrodes is substantially constant. Thus, by recognizing the position of at least one electrode on the basis of the positional information of the mark for image recognition, the position of the electrodes as a whole can be recognized. Here, the position of the electrode is defined as a notion which includes coordinates of the electrode on the insulating substrate, and a direction (angle) of the electrode relative to a line on the insulating substrate. For example, the position of the electrode can be recognized on the basis of a distance of the mark for image recognition from a predetermined reference position and/or on the basis of a deviation of an angle from a predetermined reference position.

The mark for image recognition is formed to be identifiable from the electrode or the insulating substrate on the image, for example, value (lightness, brightness) and/or saturation (chroma) of the mark for image recognition on the image differ from those of the electrode or the insulating substrate. For example, according to the first thermoelectric module of the disclosure, the mark for image recognition is formed on the electrode. In those circumstances, for example, a mark for recognition which is made from the same material to the electrode and is formed to have a protrusion and a recess. In this case, the mark for image recognition and the electrode can be recognized on the image by the shade of the mark for image recognition. Alternatively, the mark for image recognition may be formed with material whose value (lightness, brightness) and/or saturation (chroma) are different from those of a material for the electrode. In this case, the mark for image recognition and the electrode can be recognized, or identified by the color tone peculiar to the materials. Considering the accuracy and the speed of the image recognition, it is favorable to apply the material whose value (lightness, brightness) and/or saturation (chroma) are different from those of the material for the electrode to the material for the mark for image recognition.

The thermoelectric module of the disclosure is favorably applicable as the thermoelectric module for an optical communication device. Alternatively, the thermoelectric module of the disclosure is applicable to other devices. For example, in case of positioning the thermoelectric module of the disclosure to an image-capturing device, image-capturing elements, for example, CCD elements can be cooled by a thermoelectric conversion element. Further, alternatively, the thermoelectric module of the disclosure may be applied for heating besides cooling.

The insulating substrate for the thermoelectric module of the disclosure may be structured with at least one type of insulating material selected from, for example, alumina ($Al_2O_3$), aluminum nitride (AlN), and silicon nitride (SiN). Alternatively, insulating substrate for the thermoelectric module of the disclosure may be structured with at least one type of metal material (non-metal material) selected from, for example, copper, aluminum, and copper-tungsten alloy and the insulating material selected from, for example, alumina ($Al_2O_3$), aluminum nitride (AlN), and silicon nitride (SiN). For example, a surface of a main layer made from metal material may be covered with an insulating layer. In those circumstances, each of the main layer and the insulating layer may be a single layer. Alternatively, each of the main layer and the insulating layer may be plural layers.

The electrode may be formed on the insulating substrate by means of known methods, for example, electroless plating, electroplating, and pattern printing. The electrode may be connected to, for example, a lead terminal which is connected to an external power supply. Electrically conducting material, for example, copper, gold, nickel, and palladium may be selected as a material for electrode.

Embodiments of the thermoelectric module will be explained as follows. The thermoelectric module according to first to fourth embodiments is an example for a thermoelectric module 1 of the disclosure which serves as a thermoelectric module for claims 1 to 7. The thermoelectric module according to a fifth embodiment is an example for a thermoelectric module 2 of the disclosure which serves as a thermoelectric module for claim 8. According to the thermoelectric module of the first embodiment, a mark for image recognition which is formed in a protruding manner is formed on a general region of the electrode.

Constructions of the thermoelectric module will be explained as follows. As illustrated in FIG. 1, a thermoelectric module 1 of the first embodiment includes two insulating substrates (i.e., first insulating substrate 11, second insulating substrate 12), plural electrodes (i.e., first electrode 21, second electrode 22) formed on the insulating substrates, respectively, and plural peltier elements 30 mounted to each of electrodes 21, 22. The insulating substrates 11, 12 made of alumina are formed in a substantially plate shape. One of the insulating substrates serves as the first insulating substrate 11 and the other of the insulating substrates serves as the second insulating substrate 12. A surface of the first insulating substrate 11 facing the second insulating substrate 12 serves as a component side 11a of the first insulating substrate 11 to which the electrodes and peltier elements are mounted. A surface of the second insulating substrate 12 facing the first insulating substrate 11 serves as a component side 12a of the second insulating substrate 12 to which the electrodes and peltier elements are mounted. The plural electrodes 21 are formed on the component side 11a of the first insulating substrate 11. The plural electrodes 22 are formed on the component side 12a of the second insulating substrate 12. The electrodes 21, 22 are formed in strip shapes having substantially the same configuration from each other.

Each of the first electrodes 21 includes a fixture side 21c facing the first insulating substrate 11 and a component side 21d provided at the reverse of the fixture side 21c. Two peltier elements 30 are mounted (soldered) onto the component side 21d of each of the first electrode 21 along a longitudinal direction. The peltier elements 30 are mounted (soldered) onto the second electrode 22 in a similar manner. One of the peltier elements 30 mounted onto the electrodes 21, 22 which are formed in the same configuration is a P-type peltier element and the other of the peltier elements 30 mounted onto the electrodes 21, 22 is an N-type peltier element. As illustrated in FIG. 1, each of the peltier elements 30 are connected so that the P-type peltier element and the N-type peltier element are arranged alternately in series via the electrode 21 formed on the component side 11a of the first insulating substrate 11 and via the electrode 22 formed on the component side 12a of the second insulating substrate 12.

Figure 3:
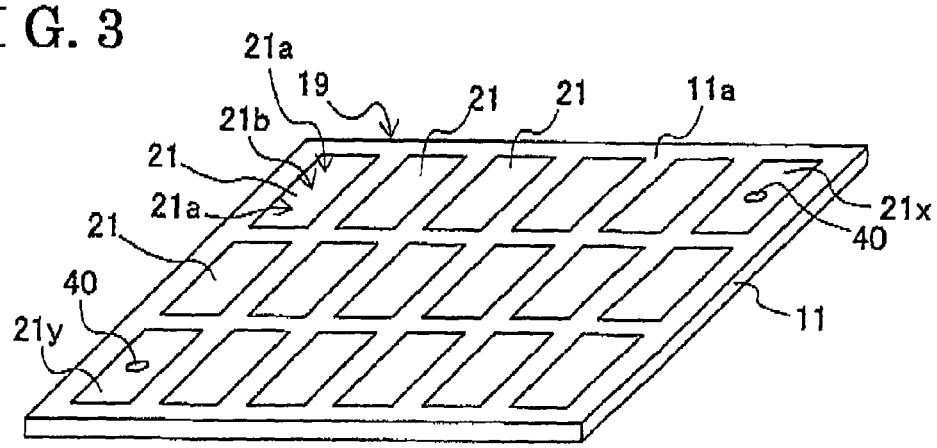
FIG. 3 is an explanatory view schematically showing a procedure for forming electrodes and marks for image recognition on the insulating substrate of the thermoelectric module according to the first embodiment disclosed here.

Each of the electrodes 21, 22 is oriented in a right-left direction or a front-rear direction in FIG. 1 on the first insulating substrate 11 and the second insulating substrate 12. As illustrated in FIG. 3, a mark 40 for image recognition is formed on an electrode 21x positioned at a rear-right end and on an electrode 21y positioned at a front-left end among the plural electrodes 21 formed on the first insulating substrate 11. Hereinafter, the electrode 21x, 21y (and an electrode 22x, 22y formed on the second insulating substrate 12) on which the mark 40 for image recognition is formed is referred to as a marked electrode. According to the first embodiment, the marked electrodes 21x, 21y are positioned on a diagonal line of the first insulating substrate 11. The mark 40 for image recognition is made from the same electrical conductive material to the electrodes 21, 22. Thus, the mark 40 for image recognition structures a part of the electrodes 21, 22. The mark 40 for image recognition is formed in a protruding manner. Thus, for example, when the images of the first insulating substrate 11, the first electrode, 21 and the mark 40 for image recognition are recognized, at least the value (lightness, brightness) of the mark 40 for image recognition differs from that of the first electrode 21 on the image. The thermoelectric module 1 according to the first embodiment can be manufactured in the following manner.

A manufacturing method of the thermoelectric module 1 according to the first embodiment will be explained as follows. The plural first electrodes 21 are formed on the first insulating substrate 11.

Figure 2A:
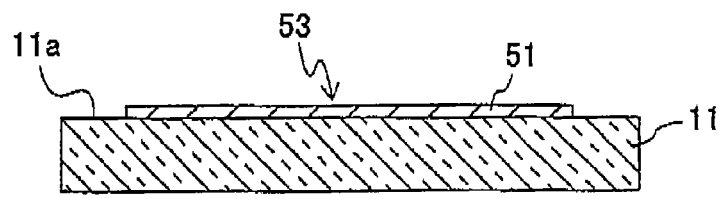
FIG. 2A is an explanatory view schematically showing a procedure forming an electrode and a mark for image recognition on an insulating substrate of the thermoelectric module according to the first embodiment disclosed here.

More particularly, copper plating, or Cu plating (electroless plating) with thickness of 20 μm is applied onto the first insulating substrate 11 with a predetermined interval and in a strip shape which is the same configuration with the configuration of the first electrode 21. In the process explained above, as illustrated in FIG. 2A, a base layer 51 which is formed with the Cu plating is formed on the first insulating substrate 11. The base layer 51 serves as a major part of the first electrode 21, and primarily serves as an energizing path of the first electrode 21.

Figure 2B:
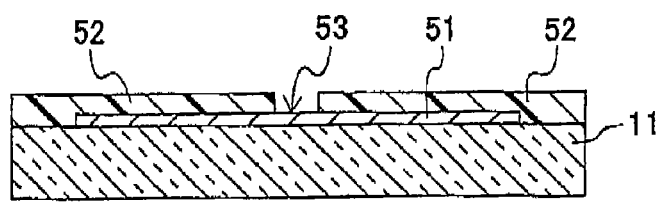
FIG. 2B is an explanatory view schematically showing a procedure for forming the electrode and the mark for image recognition on the insulating substrate of the thermoelectric module according to the first embodiment disclosed here.

Then, as illustrated in FIG. 2B, a resist layer (i.e., mask layer) 52 made of resist resin is formed on the first insulating substrate 11 on which the base layer 51 is formed. Namely, the resist layer 52 is formed on the base layer 51. In those circumstances, a portion on which the mark 40 for image recognition is to be formed (i.e., a portion 53 to which mark is to be formed) at two base layers 51 which structures the marked electrodes 21x, 21y is left without forming the resist layer 52. In other words, in the process, the resist layer 52 is formed on the entire region on the component side 11a of the first insulating substrate 11 on which the base layer 51 is formed except for the portion 53 to which mark is to be formed. As illustrated in FIG. 1, opposite end portions in the longitudinal direction of the first electrode 21 corresponds to a region on which the peltier elements 30 are mounted (i.e., mounting region 21a of the first electrode 21) and a substantially-center portion of the first electrode 21 in the longitudinal direction corresponds to a region on which the peltier element 30 is not mounted (i.e., general region 21b of the first electrode 21). The portion 53 to which mark is to be formed is formed at the general region 21b of the first electrode 21 of the marked electrodes 21x, 21y.

Figure 2C:
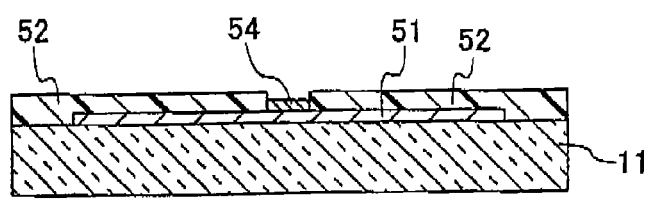
FIG. 2C is an explanatory view schematically showing a procedure for forming the electrode and the mark for image recognition on the insulating substrate of the thermoelectric module according to the first embodiment disclosed here.

Thereafter, as illustrated in FIG. 2C, copper plating, or Cu plating (electroless plating) with thickness of 5 μm is applied on the first insulating substrate 11 on which the base layer 51 and the resist layer 52 are formed. The copper-plating layer (i.e., hereinafter referred to as mark protrusion layer 54) is formed only at the portion 53 to which mark is to be formed on which the resist layer 52 is not formed among the base layer 51.

Figure 2D:
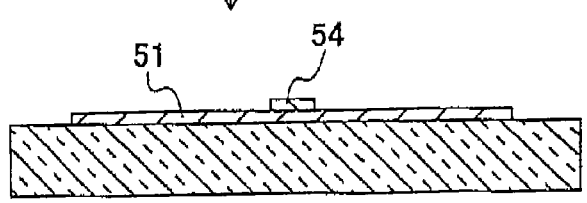
FIG. 2D is an explanatory view schematically showing a procedure for forming the electrode and the mark for image recognition on the insulating substrate of the thermoelectric module according to the first embodiment disclosed here.
Figure 2E:
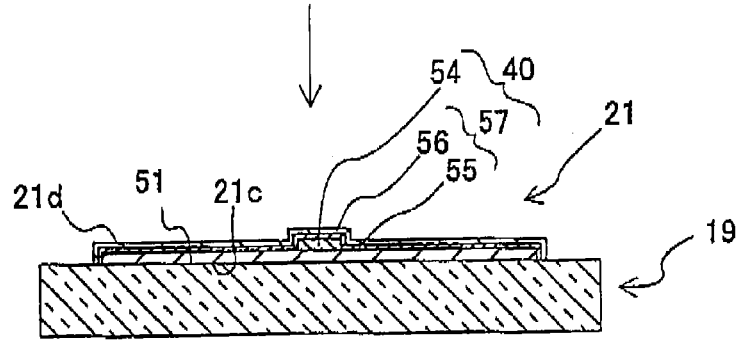
FIG. 2E is an explanatory view schematically showing a procedure for forming the electrode and the mark for image recognition on the insulating substrate of the thermoelectric module according to the first embodiment disclosed here.

Then, as illustrated in FIG. 2D, the resist layer 52 is removed. Thereafter, as illustrated in FIG. 2E, nickel plating, or Ni plating (electroless plating) with thickness of 4 μm is applied on an entire surface of the first electrode 21, and gold plating, or Au plating (electroless plating) with thickness of 0.3 μm is applied on the Ni plating layer. In the process, a surface layer 57 which includes the Ni plating layer 55 and the Au plating layer 56 is formed on the base layer 51. The Ni plating layer 55 and the Au plating layer 56 are provided in order to restrain the first electrode 21 (particularly, base layer 51) from being oxidized, and in order to firmly join the first electrode 21 and the solder used for mounting the peltier element 30. The mark 40 for image recognition is structured with the mark protrusion layer 54 and the surface layer 57. The mark 40 for image recognition projects upward of the first electrode 21 by a thickness of the mark protrusion layer 54.

According to the first embodiment, the mark protrusion layer 54 is formed with copper plating, or Cu plating. However, materials for the mark protrusion layer 54 is not limited, for example, the mark protrusion layer 54 may be formed with Ni plating, or alternatively, with Au plating. In the process described above, a first electrode unit 19 in which the mark 40 for image recognition having a protruding configuration is formed on the general region 21b of the marked electrodes 21x, 21y is obtained (see FIG. 3).

As described above, the mark 40 for image recognition includes the mark protrusion layer 54 and the surface layer 57. The thickness of the base layer 51 at each of the first electrodes 21 is substantially constant, and the mark 40 for image recognition is formed on the base layer 51. Thus, the base layer 51, that is, the electrical conduction path is provided extending over the entire first electrode 21. In other words, because the base layer 51 extends over the entire first electrode 21, the entire first electrode 21 functions as the electrical conduction path, and the electrical conductivity and the electrical resistance of the first electrode 21 are unlikely affected by whether the mark 40 for image recognition is provided or not. Thus, according to the thermoelectric module 1 of the first embodiment, a decline of the electric conductivity and an increase of the electrical resistance of the first electrode 21 due to the mark 40 for image recognition are avoidable. For example, the mark 40 for image recognition is formed in a substantially circular form with a diameter of approximately 0.2 millimeters. A distance between mounting regions 21a of the first electrode 21, that is, a width of the general region 21b of the first electrode 21 is, for example, approximately 0.4 millimeters. A distance between the first electrodes 21 which are adjacent from each other is, for example, approximately, 0.15 millimeters. Thus, it is difficult to form the mark 40 for image recognition between the first electrodes 21, 21 which are adjacent from each other, however, the mark 40 for image recognition is readily formed on the general region 21b on the first electrode 21.

Similarly to the method for forming the first electrode unit 19, the second electrode 22 is formed on the second insulating substrate 12 to obtain a second electrode unit 29. Similarly to the first electrode unit 19, in the second electrode unit 29, two second electrodes 22 which are positioned on a diagonal line on the second insulating substrate 12 are defined as marked electrodes, and the mark 40 for image recognition is formed on each of the marked electrodes.

Figure 4:
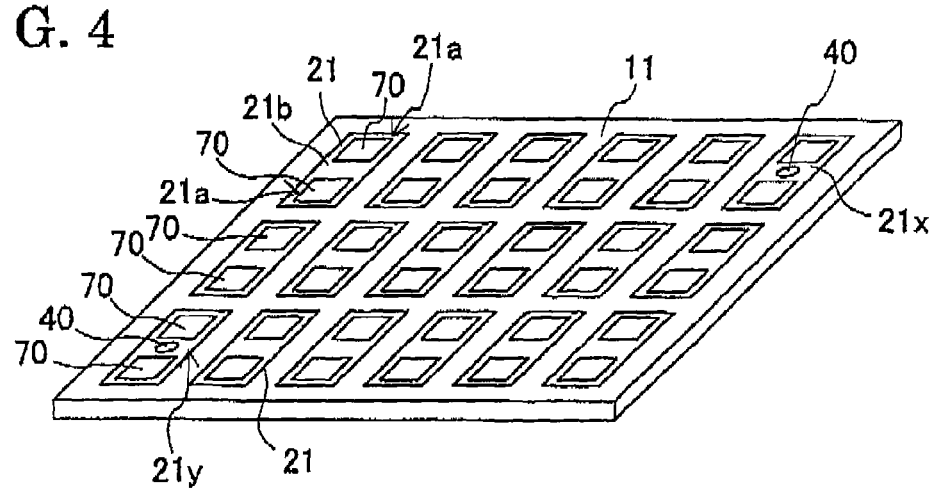
FIG. 4 is an explanatory view schematically showing a procedure for forming the electrodes and the marks for image recognition on the insulating substrate of the thermoelectric module according to the first embodiment disclosed here.
Figure 5:
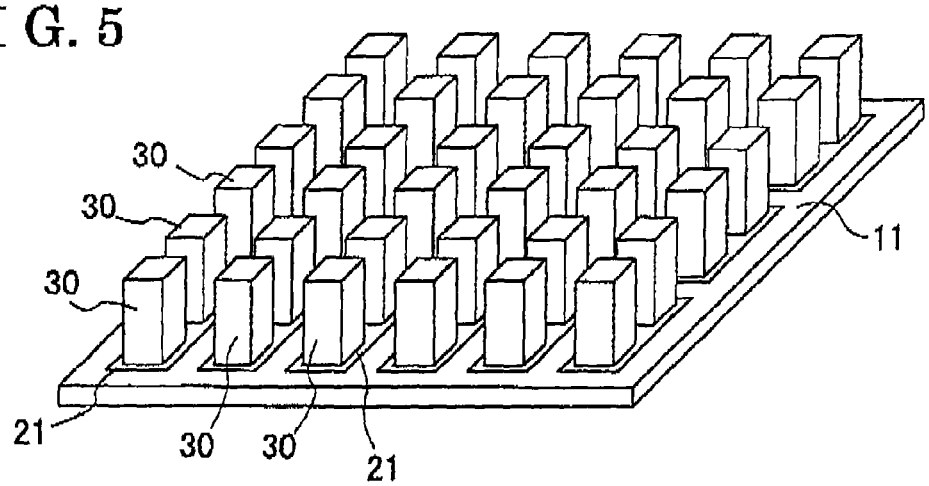
FIG. 5 is an explanatory view schematically showing a procedure for mounting peltier elements on the electrodes of the thermoelectric module according to the first embodiment disclosed here.

Next, the insulating substrate to which the electrode and the mark 40 for image recognition are formed (i.e., first electrode unit 19 shown in FIG. 3) is set at a mounter, or component mounter. An image recognition device including CCD elements is provided at the mounter. The image recognition device captures an image of the first electrode unit 19. Because the mark 40 for image recognition is formed in a protruding manner, shade is projected, and thus the mark 40 for image recognition is shown with the value (lightness, brightness) that is different from the value (lightness, brightness) of the first electrode 21 on the image. Accordingly, the position of the mark 40 for image recognition on the first insulating substrate 11 can be readily calculated, or measured. On the basis of the position of the mark 40 for image recognition obtained in the foregoing manner, a positional difference of a predetermined reference position of each of the first electrodes 21 from an actual position of the first electrode 21 (i.e., degree of positional deviation) is calculated. Further, an angular difference (degree of angular deviation) of the actual position of the first electrode 21 and the predetermined reference position of the first electrode 21 is calculated. Then, on the basis of the degree of the angular deviation and the degree of the positional deviation of each of the first electrodes 21, the position on which the solder needs to be printed and the position on which the peltier element 30 needs to be mounted on each of the first electrodes 21 are calculated. Thereafter, on the basis of the calculated mount position of the peltier element 30, solder 70, for example, containing 80 percent of Au and 20 percent of Sn, is applied by screen-printing on the mounting region 21a of the first electrode 21 (see FIG. 4). Then, the peltier elements 30 are automatically mounted onto the applied solder 70 (see FIG. 5). Still further, the second electrode unit 29 on which the solder 70 is printed in the similar procedure is automatically mounted onto the peltier elements 30, and then heated to obtain the thermoelectric module 1 according to the first embodiment.

A second embodiment of the thermoelectric module 1 will be explained as follows with reference to FIGS. 6 and 7. Constructions of the thermoelectric module 1 of the second embodiment are common to the first embodiment other than a configuration of the electrode, the position of the mark 40 for image recognition, and materials for the mark 40 for image recognition. Manufacturing processes of the thermoelectric module 1 of the second embodiment will be explained with reference to FIGS. 6 and 7.

According to the thermoelectric module 1 of the second embodiment, the mark 40 for image recognition which is formed with the resist layer 52 is formed on the general region 21b of the first electrode 21. The mark 40 for image recognition, that is, the resist layer 52 is formed as an upper layer on the surface layer 57. Similarly, the resist layer 52 is formed as an upper layer on the surface layer 57 in the second electrode 22. The thermoelectric module 1 of the second embodiment may be manufactured in the following manner.

First, as illustrated in FIG. 6A, the copper plating, or Cu plating (electroless plating) is applied on the first insulating substrate 11 to form the base layer 51. Then, as illustrated in FIG. 6B, nickel plating, or Ni plating (electroless plating) is applied on an entire upper surface of the base layer 51 to form the Ni plating layer 55. Further, as illustrated in FIG. 6C, gold plating, or Au plating (electroless plating) is applied to an upper surface of the Ni plating layer 55 to form the Au plating layer 56. In the process, the first electrode 21 including the base layer 51 (Cu plating layer) and the surface layer 57 (Ni plating layer 55, Au plating layer 56) is formed. Thereafter, as illustrated in FIG. 6D, the resist resin is further applied (printed) onto the general region 21b at the surface layer 57 of two marked electrodes 21x, 21y to form the resist layer 52. The resist layer 52 is the mark 40 for image recognition at the thermoelectric module 1 according to the second embodiment. The resist layer 52 is formed in a substantially circular configuration with a diameter approximately 0.3 millimeters. In the processed explained above, the first electrode unit 19 of the thermoelectric module 1 according to the second embodiment is obtained. Further, in similar processes, the second electrode unit 29 of the thermoelectric module 1 according to the second embodiment is obtained. Because the lightness (brightness, value) and saturation (chroma) of the resist resin are significantly different from the lightness (brightness, value) and saturation (chrome) of gold, or Au forming the surface layer 57 of the first electrode 21, the mark 40 for image recognition is distinguishable from the electrode 21 on the image. The plural peltier elements 30 are automatically mounted to the first electrode unit 19 obtained in the foregoing manner similarly to the method disclosed in the first embodiment. Then, the second electrode unit 29 is automatically mounted onto the peltier elements 30. Thus, the thermoelectric module 1 of the second embodiment is obtained.

As illustrated in FIG. 7, according to the second embodiment, an electrode 21y positioned at a left-hand end and at substantially center portion in the front-rear direction and an electrode 21x positioned at a right-hand end and at substantially center portion in the front-rear direction are defined as marked electrodes 21x, 21y. The mark 40 for image recognition is formed on each of the marked electrodes 21x, 21y. According to the first electrode unit 19 and the second electrode unit 29 of the second embodiment, a distance between two marks 40 for image recognition is smaller than a distance between the marks 40 for image recognition of the first electrode unit 19 and the second electrode unit 29 of the first embodiment. However, according to the second embodiment, because the plural marks 40 for image recognition are formed on separate electrodes 21x, 21y, respectively, a sufficient distance is ensured between the marks 40 for image recognition, and the positions of the electrodes 21, 22 can be recognized with high precision.

A third embodiment will be explained with reference to FIGS. 8A-8F. The constructions of the thermoelectric module 1 according to the third embodiment are common to the second embodiment other than the position of the mark 40 for image recognition and the materials which the mark 40 for image recognition is made of. A manufacturing method of the thermoelectric module 1 according to the third embodiment will be explained as follows with reference to FIGS. 8A-8F.

The mark 40 for image recognition of the thermoelectric module 1 according to the third embodiment is formed with a black nickel-plating layer, or black Ni plating layer 58. The black Ni plating layer is formed on the general region 21b at the surface layer 57 of the first electrode 21. The lightness (brightness, value) and saturation (chrome) of the black nickel, or black Ni are significantly different from the lightness (brightness, value) and saturation (chrome) of the gold, or Au forming the surface (uppermost surface) of the surface layer 57 on the image. Thus, the first electrode 21 and the mark 40 for image recognition are distinguishable on the image. The black Ni plating layer 58 is formed by plating the black Ni. As a material for black Ni plating (plating bath), a mixed Ni plating bath which is obtained by adding, for example, boric acid ion and amino acid to the Ni plating bath may be applicable.

According to the third embodiment, by the selection of the black Ni which is the electrically conductive material as the material for the mark 40 for image recognition, the mark 40 for image recognition serves as a part of the first electrode 21, and a decline of the electric conductivity and increase in the electrical resistance of the first electrode 21 because of the mark 40 for image recognition is avoidable with further higher reliability. The same is applied to the second electrode 22. The thermoelectric module 1 of the third embodiment is manufactured as follows.

Figure 8A:
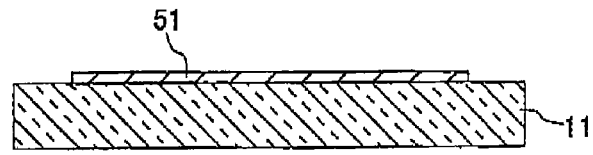
FIG. 8A is an explanatory view schematically showing a procedure for manufacturing a thermoelectric module according to a third embodiment disclosed here.
Figure 8B:
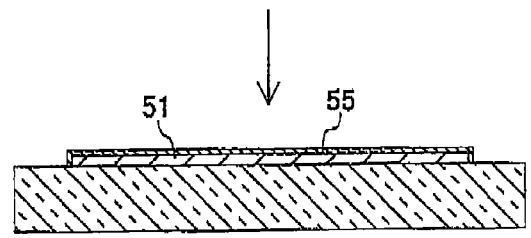
FIG. 8B is an explanatory view schematically showing a procedure for manufacturing the thermoelectric module according to the third embodiment disclosed here.
Figure 8C:
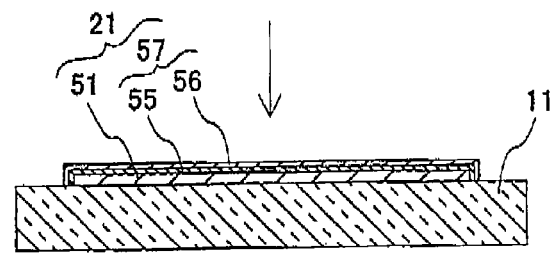
FIG. 8C is an explanatory view schematically showing a procedure for manufacturing the thermoelectric module according to the third embodiment disclosed here.
Figure 8D:
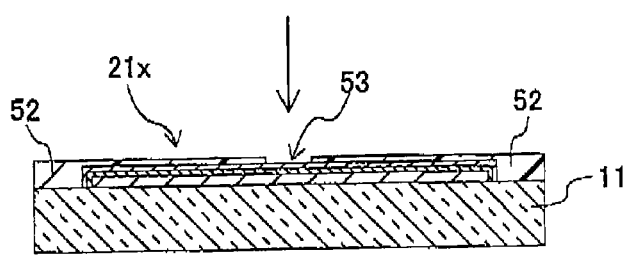
FIG. 8D is an explanatory view schematically showing a procedure for manufacturing the thermoelectric module according to the third embodiment disclosed here.
Figure 8E:
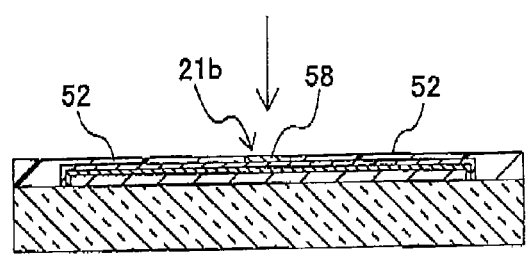
FIG. 8E is an explanatory view schematically showing a procedure for manufacturing the thermoelectric module according to the third embodiment disclosed here.
Figure 8F:
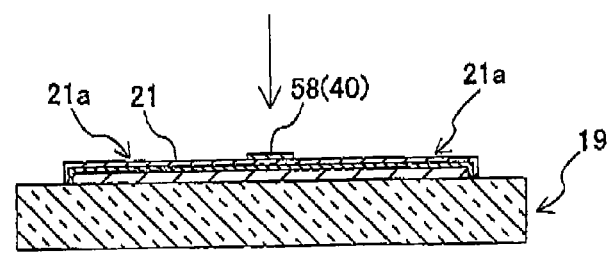
FIG. 8F is an explanatory view schematically showing a procedure for manufacturing the thermoelectric module according to the third embodiment disclosed here.

First, similarly to the first embodiment, the copper plating, or Cu plating is applied to the first insulating substrate 11 to form the base layer 51 of the first electrode 21 (see FIG. 8A). Then, the Ni plating layer 55 is formed on the base layer 51 (see FIG. 8B), and the gold layer, or Au plating layer 56 is formed on the Ni plating layer 55 (see FIG. 8c). In the processes, the first electrode 21 including the surface layer 57, which includes the Ni plating layer 55 and the Au plating layer 56, and the base layer 51 made from the Cu plating layer is formed.

Next, two first electrodes 21x, 21y positioned at the same position to the first embodiment are selected as the marked electrodes, and the mark 40 for image recognition is formed on each of the marked electrodes 21x, 21y. More particularly, the resist resin is applied to the first electrodes 21 other than the marked electrodes 21x, 21y, to the first insulating substrate 11, and to a portion of the marked electrode 21x, 21y other than the portion 53 to which the mark is to be formed to form the resist layer 52 (see FIG. 8D). At the process, the resist layer 52 is not formed at the portion 53 to which the mark is to be formed. The black Ni plating is applied to the portion 53 to which the mark is to be formed to form the black Ni plating layer 58 (see FIG. 8E). Thereafter, the resist layer 52 is removed, and the first electrode unit 19 in which the mark 40 for image recognition including the black Ni plating layer 58 is formed on the general region 21b of the first electrode 21 is obtained (see FIG. 8F). Further, the second electrode unit 29 is obtained by the similar process. Then, similarly to the first embodiment, the arrangement of the first electrode 21 is recognized by the image recognition, the plural peltier elements 30 are automatically mounted onto the first electrode unit 19, and further, the second electrode unit 29 is automatically mounted onto the plural peltier elements 30. Thus, the thermoelectric module 1 of the third embodiment is obtained.

A fourth embodiment of the thermoelectric module 1 will be explained as follows with reference to FIGS. 9 to 12. Constructions of the thermoelectric module 1 according to the fourth embodiment are common to the constructions according to the third embodiment other than that the mark 40 for image recognition is formed on every first electrode 21 and second electrode 22, the configuration of the first electrode 21 and the second electrode 22, the configuration of the mark 40 for image recognition, and the materials applied to the mark 40 for image recognition. A manufacturing method of the thermoelectric module 1 according to the fourth embodiment will be explained as follows with reference to FIGS. 9 to 12.

Figure 10:
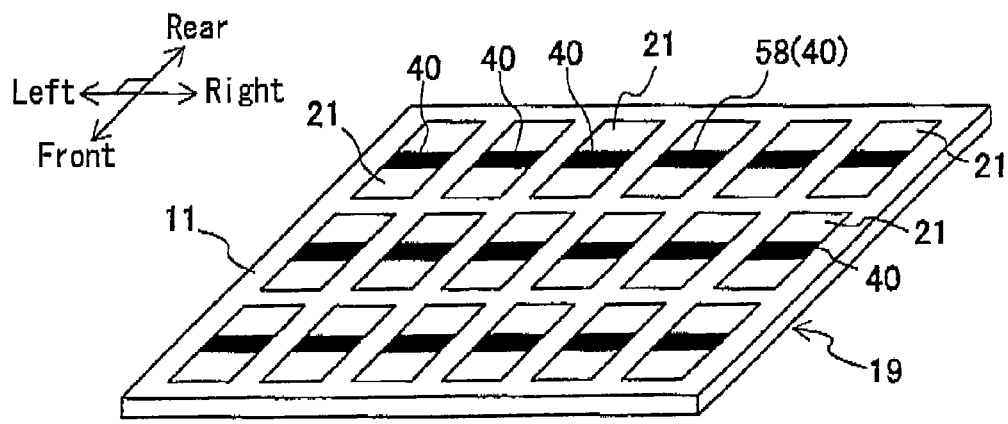
FIG. 10 is an explanatory view schematically showing a procedure for manufacturing the thermoelectric module according to the fourth embodiment disclosed here.
Figure 11:
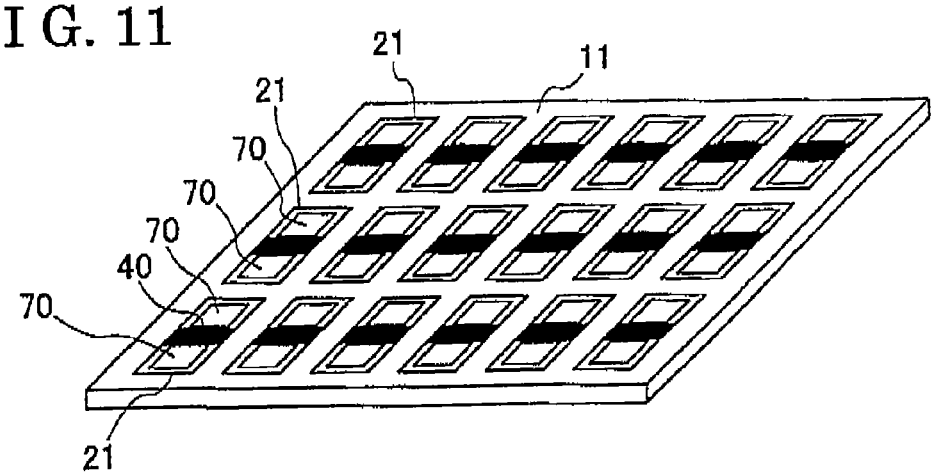
FIG. 11 is an explanatory view schematically showing a procedure for manufacturing the thermoelectric module according to the fourth embodiment disclosed here.
Figure 12:
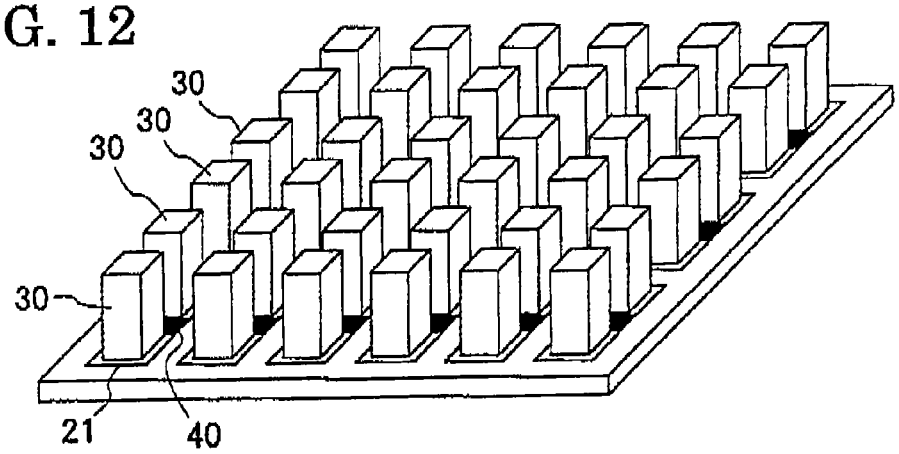
FIG. 12 is an explanatory view schematically showing a procedure for manufacturing the thermoelectric module according to the fourth embodiment disclosed here.

According to the thermoelectric module 1 of the fourth embodiment, the first electrode 21 includes the base layer 51 and the surface layer 57. The base layer 51 corresponds to a copper plating layer, or Cu plating layer which is formed by Cu plating similarly to the first embodiment. A portion of the surface layer 57 which serves as a mounting region 21a of the first electrode 21 (i.e., a mounting portion 57a of the surface layer 57, or a surface layer mounting portion 57a) is differentiated from a portion of the surface layer 57 which serves as a general region 21b of the first electrode 21 (i.e., a general portion 57b of the surface layer 57, or a surface layer general portion 57b). The mounting portion 57a of the surface layer 57 includes two layers including the Ni plating layer 55 and the Au plating layer 56 similar to the surface layer 57 of the first embodiment. On the other hand, the general portion 57b of the surface layer 57 is structured only with the Ni plating layer 55. Thus, the general portion 57b of the surface layer 57 is thinner than the mounting portion 57a of the surface layer 57. A difference in level is formed between the mounting portion 57a of the surface layer 57 and the general portion 57b of the surface layer 57. In every first electrode 21, the black Ni plating is applied to the general portion 57b of the surface layer 57 to form the black Ni plating layer 58. The black Ni plating layer 58 fills the difference in level between the mounting portion 57a of the surface layer 57 and the general portion 57b of the surface layer 57. That is, according to the thermoelectric module 1 of the fourth embodiment, the mark 40 for image recognition in which the black Ni plating layer 58 is formed on the general portion 57b of the surface layer 57 is formed at every first electrode 21. As illustrated in FIG. 10, the mark 40 for image recognition is formed in a band shape (e.g., 0.4 millimeters by 0.2 millimeters), and a longitudinal direction (i.e., right-left direction in FIG. 10) of the mark 40 for image recognition is oriented in a direction substantially orthogonal to a longitudinal direction (i.e., front-rear direction) of the first electrode 21. According to the thermoelectric module 1 of the fourth embodiment, the mark 40 for image recognition is formed in a band shape. That is, the mark 40 for image recognition of the fourth embodiment is formed in the configuration which is directional and is likely to detect the positional deviation in a rotational direction, whereas the circular configuration is not directional and is difficult to detect the positional deviation in a rotational direction. With the construction of the mark 40 for image recognition, particularly, angular deviation of the first electrode 21 (that is, the angular deviation of the mark 40 for image recognition relative to a predetermined reference position) is likely to be recognized. Thus, according to the thermoelectric module 1 of the fourth embodiment, even if the mark 40 for image recognition formed in the same configuration is formed on every first electrode 21, the position and angle of the first electrode 21 can be recognized with high reliability.

The mark 40 for image recognition is made from electrically conductive material and the surface of the black Ni plating layer 58 (i.e., mark 40 for image recognition) is flush with the surface of the Au plating layer 56 (i.e., the surface of the general portion 57b of the surface layer 57, the general region 21b of the first electrode 21). Thus, there is no level difference on the surface of the first electrode 21, and thus the solder 70 is likely to be automatically applied thereto. Further, according to the construction of the fourth embodiment, the mark 40 for image recognition can be provided at the first electrode 21 while restraining the electric conductivity of the first electrode 21 from declining and the surface of the first electrode 21 including the mark 40 for image recognition is formed to be flat, or even. Thus, according to the construction of the fourth embodiment, for example, the provided position of the mark 40 for image recognition is not limited to the general region 21b of the first electrode 22 and the mark 40 for image recognition may be positioned at the mounting region 21a of the first electrode 21. The same is applied to the second electrode 22. The thermoelectric module 1 of the fourth embodiment is manufactured in the following manner.

Figure 9A:
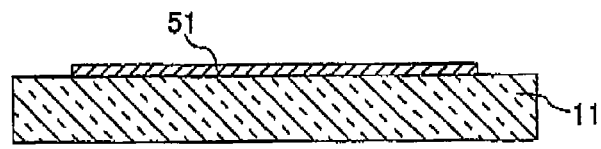
FIG. 9A is an explanatory view schematically showing a procedure for manufacturing a thermoelectric module according to a fourth embodiment disclosed here.
Figure 9B:
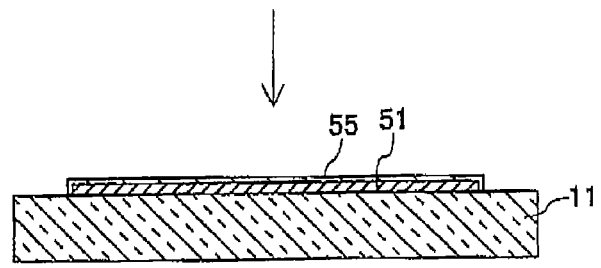
FIG. 9B is an explanatory view schematically showing a procedure for manufacturing the thermoelectric module according to the fourth embodiment disclosed here.
Figure 9C:
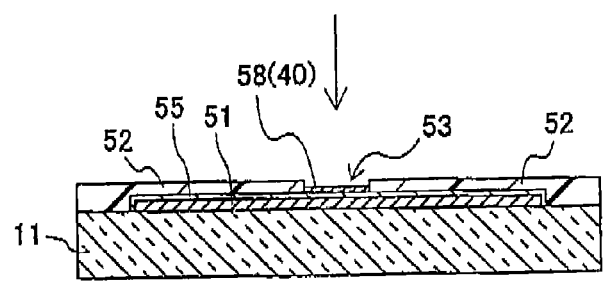
FIG. 9C is an explanatory view schematically showing a procedure for manufacturing the thermoelectric module according to the fourth embodiment disclosed here.
Figure 9D:
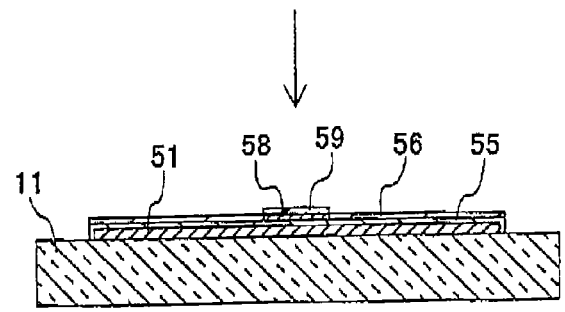
FIG. 9D is an explanatory view schematically showing a procedure for manufacturing the thermoelectric module according to the fourth embodiment disclosed here.
Figure 9E:
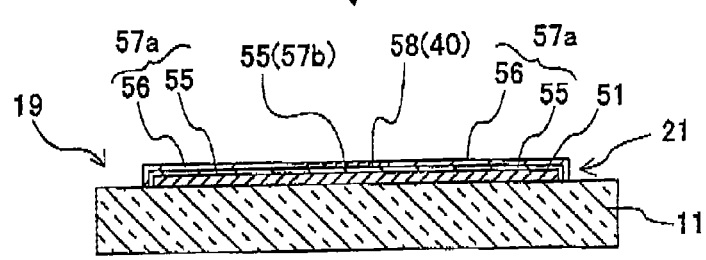
FIG. 9E is an explanatory view schematically showing a procedure for manufacturing the thermoelectric module according to the fourth embodiment disclosed here.

First, similarly to the first embodiment, the copper plating, or Cu plating is applied to the first insulating substrate 11 to form the base layer 51 of the first electrode 21 (see FIG. 9A). Next, the Ni plating layer 55 is formed on the base layer 51 (see FIG. 9B). The thickness of the base layer 51 is, for example, 20 μm. The thickness of the Ni plating layer 55 is, for example, 6 μm. Next, the resist layer 52 is formed on the first insulating substrate 11 which is formed with the Ni plating layer 55. Particularly, a substantially center portion of every first electrode 21 is defined as the portion 53 to which the mark is to be formed, and a portion which structures the portion 53 to which the mark is to be formed among each of the Ni plating layers 55 and the first insulating substrate 11 (i.e., hereinafter referred to as the portion 53 to which the mark is to be formed) is left and the resist resin is applied to the rest of the portion to form the resist layer 52. Then, the black Ni plating is applied to the portion 53 to which the mark is to be formed to form the black Ni plating layer 58 (See FIG. 9C). Thereafter, the resist layer 52 is removed to form a second resist layer 59 on the black Ni plating layer 58. In those circumstances, the second resist layer 59 is not formed at a potion of each of the Ni plating layers 55 at which the black Ni plating layer 58 is not formed (i.e., the second resist layer 59 is not formed at the portion to which the peltier element 30 is mounted)(see FIG. 9D). Thereafter, the gold plating, or Au plating is applied to the portion on the Ni plating layer 55 at which the second resist layer 59 is not formed to form the Au plating layer 56, and the second resist layer 59 is removed. In the foregoing processes, the first electrode unit 19 in which the mark 40 for image recognition made from the black Ni plating layer 58 is formed on the general region of every first electrode 21 is obtained (see FIG. 9E, FIG. 10).

Here, the thickness of the black Ni plating layer 58 is, for example, 0.5 μm and the thickness of the Au plating layer 56 is, for example, 0.5 μm. The second electrode unit 29 is obtained in the similar process to the manufacturing method for the first electrode unit 19. Then, similarly to the first embodiment, the image of the first electrode unit 19 is recognized, and the position and the angle of the first electrode 21 is calculated on the basis of the positional information of the mark 40 for image recognition. On the basis of the arrangement (position and angle) of each of the first electrodes 21 obtained in the foregoing manner, the solder 70 is automatically applied to each of the first electrodes 21 (see FIG. 11), and the plural peltier elements 30 are automatically mounted (see FIG. 12). Thereafter, the second electrode unit 29 is automatically mounted onto the plural peltier elements 30. Thus, the thermoelectric module 1 of the fourth embodiment is obtained.

A thermoelectric module 2 according to a fifth embodiment will be explained as follows with reference to FIGS. 13 to 15. Constructions of the thermoelectric module 2 of the fifth embodiment are common to the constructions of the fourth embodiment other than the configuration of the first electrode 21 and the second electrode 22, the configuration of the mark 40 for image recognition, and the materials for the mark 40 for image recognition.

Figure 13:
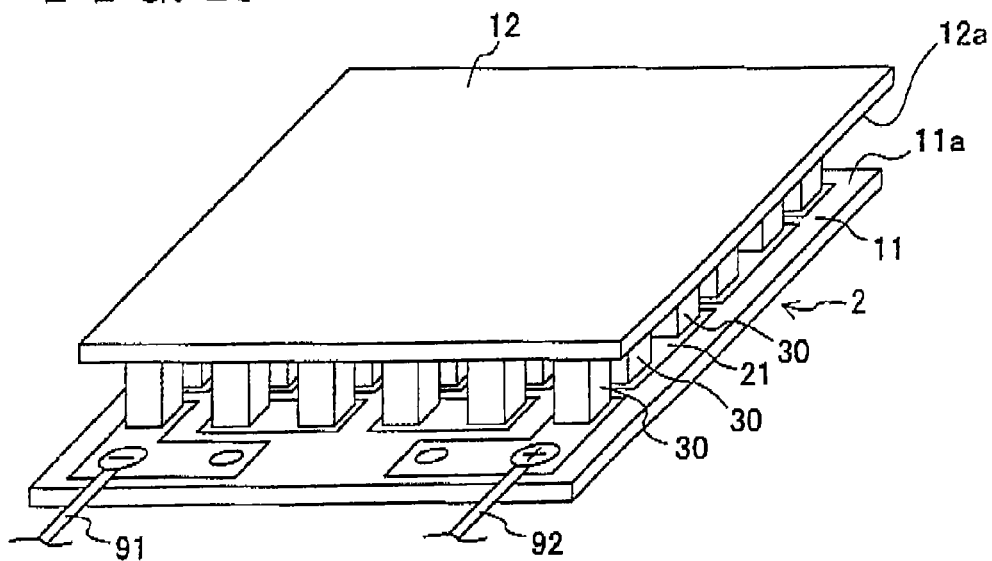
FIG. 13 is a perspective view schematically showing a thermoelectric module according to a fifth embodiment disclosed here.
Figure 14:
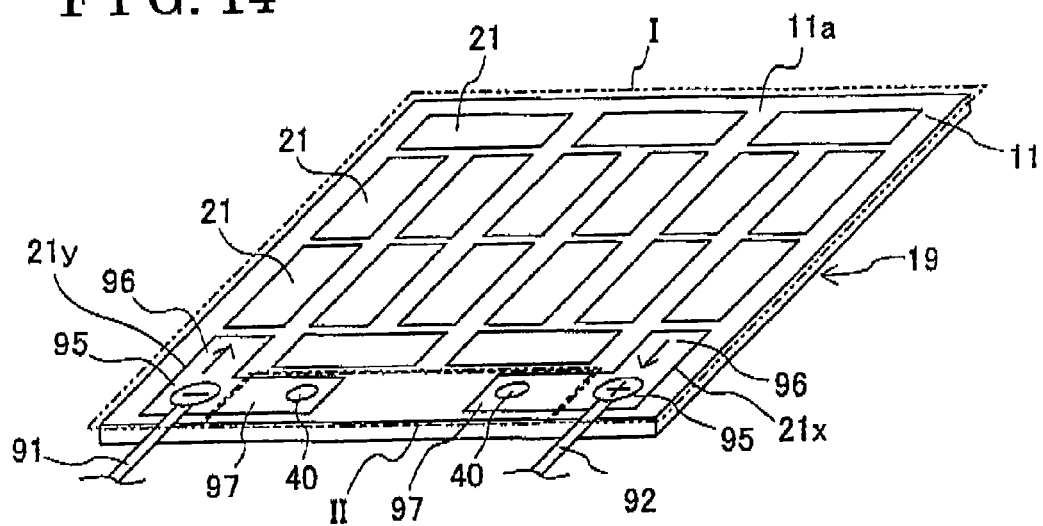
FIG. 14 is a perspective view schematically showing a first unit of the thermoelectric module according to the fifth embodiment disclosed here.

As illustrated in FIG. 13, the thermoelectric module 2 of the fifth embodiment, similarly to the thermoelectric module 1 of the first embodiment, includes the first insulating substrate 11, the second insulating substrate 12, the plural first electrodes 21 formed on the component side 11a of the first insulating substrate 11, the plural second electrodes 22 formed on the component side 12a of the second insulating substrate 12, and the plural peltier elements 30 mounted on each of the electrodes 21, 22 and electrically connected thereto. As illustrated in FIG. 14, the component side of the first insulating substrate 11 includes a conduction path region I and a general region II. The conduction path region I is formed with electrical conduction paths including the plural first electrodes 21 and the plural peltier elements 30. The general region II is the portion of the component side other than the conduction path region I, and is the portion which is not directly involved with the conduction of the electricity.

In the thermoelectric module 2 of the fifth embodiment, two first electrodes 21 directly connected to leads 91, 92 among the plural first electrodes 21 are defined as the marked electrodes 21x, 21y. Each of the marked electrodes 21x, 21y is formed in a substantially L-shape. A connection portion 95 connected to the lead 91 or the lead 92 is formed in a substantially center portion of each of the marked electrodes 21x, 21y. The peltier element 30 is mounted onto the first end portion 96 of the marked electrodes 21x, 21y. The mark 40 for image recognition is formed on a second end portion 97 of the marked electrodes 21x, 21y. The electricity conducts the connection portion 95 and the first end portion 96 of each of the marked electrodes 21x, 21y, and the connection portion 95 and the first end portion 96 are formed at the conduction path region I of the first insulating substrate 11. The second end portion 97 of each of the marked electrodes 21x, 21y is not directly involved with the electric conduction and is formed in the general region II of the first insulating substrate 11. In the thermoelectric module 2 of the fifth embodiment, the mark 40 for image recognition is formed in a recessed manner. The thermoelectric module 2 of the fifth embodiment is manufactured as follows, for example.

Figure 15A:
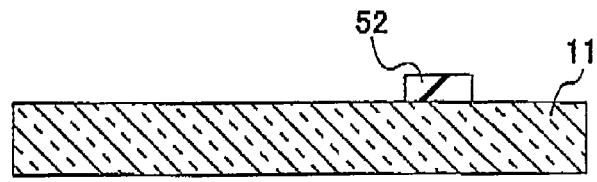
FIG. 15A is an explanatory view showing a procedure for manufacturing the thermoelectric module according to the fifth embodiment disclosed here.
Figure 15B:
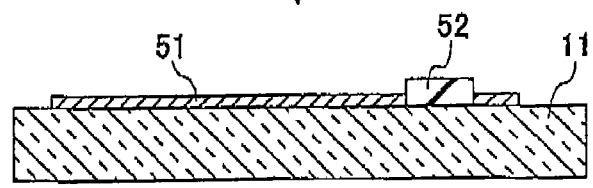
FIG. 15B is an explanatory view showing a procedure for manufacturing the thermoelectric module according to the fifth embodiment disclosed here.
Figure 15C:
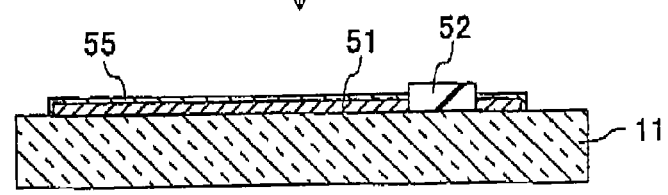
FIG. 15C is an explanatory view showing a procedure for manufacturing the thermoelectric module according to the fifth embodiment disclosed here.
Figure 15D:
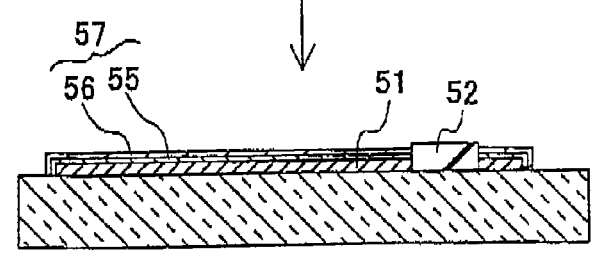
FIG. 15D is an explanatory view showing a procedure for manufacturing the thermoelectric module according to the fifth embodiment disclosed here.
Figure 15E:
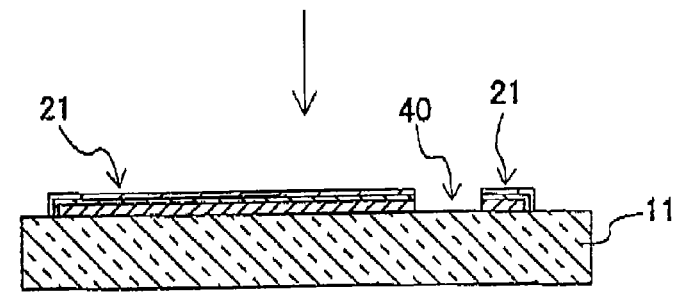
FIG. 15E is an explanatory view showing a procedure for manufacturing the thermoelectric module according to the fifth embodiment disclosed here.

First, the resist layer 52 is formed at a portion on the first insulating substrate 11 corresponding to the portion 53 to which the mark is to be formed (see FIG. 15A). Next, the copper plating, or Cu plating is applied to the first insulating substrate 11 on which the resist layer 52 is formed to form the base layer 51 for each of the electrodes. Further, the Ni plating layer 55 is formed on the base layer 51 (see FIG. 15C), and the Au plating layer 56 is formed on the Ni plating layer 55 (see FIG. 15D). The thicknesses of the base layer 51, the Ni plating layer 55, and the Au plating layer 56 are the same to those of the first embodiment. In the processes, the first electrode 21 including the base layer 51 (i.e., Cu plating layer) and the surface layer 57 (i.e., Ni plating layer 55 and the Au plating layer 56) is formed (See FIG. 15E). Further, by removing the resist layer 52, the mark 40 for image recognition which is formed in a recessed configuration is formed. The mark 40 for image recognition is formed at a region outside the electrical conduction path of the electrode. Thus, according to the thermoelectric module 2 of the fifth embodiment, despite the construction that the mark 40 for image recognition is formed inside the first electrode 21, declines of the electric conductivity and an increase in the electrical resistance due to the mark 40 for image recognition unlikely occur.

According to the fifth embodiment, the mark 40 for image recognition is formed at the first electrode 21 (marked electrodes 21x, 21y). However, alternatively, the mark 40 for image recognition may be directly formed on the general region II of the first insulating substrate 11. In those circumstances, the mark 40 for image recognition does not interfere with the conduction path of the first electrode 21. Further, the mark 40 for image recognition with recessed configuration may be formed by removing a part of thickness or an entire thickness of the first electrode 21 by means of an electrical wiring pattern creation method, for example, etching after forming the first electrode 21.

The construction of the thermoelectric module is not limited to the embodiments explained above. For example, whereas the electrode is formed on the insulating substrate structuring the single thermoelectric module 1, 2 according to the embodiment described above, alternatively, electrodes for the plural thermoelectric modules may be formed on a large-sized insulating substrate and the plural thermoelectric modules may be divided into an individual thermoelectric module 1, 2 using a method, for example, dicing, or die cutting. According to the embodiment described above, the Cu plating is applied onto the insulating substrate to correspond to the finished configuration of the electrode as the base layer 51, however, alternatively, an electrode may be shaped in a predetermined configuration on the insulating substrate. For example, after applying the Cu plating over the entire conduction path region I of the insulating substrate, the Cu plating may be shaped to be the configuration of the electrode by means of the etching method. Further alternatively, an electrically conductive material (e.g., copper, magnesium-molybdenum alloy) in paste state is screen-printed on the insulating substrate and firing the screen-printed conductive material thereafter to form the electrode. In case of plating the electrode, either electroless plating or electroplating may be applied.

According to the construction of the embodiment, the thermoelectric module (1) includes the insulating substrate (11, 12), the plural electrodes (21, 22) formed on the component side of the insulating substrate (11, 12), the plural peltier elements (30) each mounted on and electrically connected to the electrodes (21, 22), and the mark (40) for image recognition formed at least one of the electrodes, the mark (40) for image recognition having lightness and/or saturation which is different from lightness and/or saturation of the electrode on an image. In those circumstances, an entire of the electrode (21, 22) is usable as an electrical conduction path.

According to the construction of the disclosure, although the mark 40 for image recognition is formed on the electrode 21, 22, the entire electrode can be used as the electrical conduction path. Thus, a decline of the electric conductivity and an increase of the electrical resistance of the electrode because of the mark 40 for image recognition are avoidable.

According to the construction of the embodiment, the thermoelectric module (2) includes the insulating substrate (11) including the component side (11a), the plural electrodes (21) formed on the component side (11a) of the insulating substrate (11), and the plural peltier elements (30) each mounted on and electrically connected to the electrodes (21). The component side (11a) of the insulating substrate (11) includes the conduction path region (I) in which an electrical conduction path including the plurality of peltier elements (30) and the plurality of electrodes are formed, and the general region (II) of the insulating substrate (11) which is a portion other than the conduction path region (I). The general region (II) of the insulating substrate (11) is formed with the plural marks (40) for image recognition whose lightness and/or saturation is different from lightness and/or saturation of the insulating substrate (11) on an image.

According to the construction of the disclosure, because the mark 40 for image recognition is formed at the general region II of the substrate 11, that is, outside the electrical conduction path, a decline of the electric conductivity and an increase of the electrical resistance of the electrode because of the mark 40 for image recognition are avoidable. Further, outside of the electrical conduction path on the insulating substrate 11, that is, a portion of the insulating substrate 11 on which the electrode 21 and the peltier element 30 are not provided has an allowance on which the mark 40 for image recognition can be positioned.

According to the construction of the embodiment, the electrode (21) includes the fixture side (21c) facing the insulating substrate (11) and the component side (21d) provided at a reverse side of the fixture side (21c). The component side (21d) of the electrode (21) includes the mounting region (21a) on which the peltier elements (30) are mounted and the general region (21b) which is a region other than the mounting region (21a) of the electrode (21). The mark (40) for image recognition is formed on the general region (21b) of the electrode (21, 22).

According to the construction of the embodiment, the mark (40) for image recognition includes the plural marks (40) for image recognition and each of the marks (4) for image recognition is formed on the separate electrode (21, 22).

According to the construction of the embodiment, the mark (40) for image recognition including a protruding configuration is formed on at least a portion of the general region (21b) of the electrodes (21, 22).

According to the construction of the embodiment, the mark (40) for image recognition is made from an electrically conductive material having lightness and saturation which is different from lightness and saturation of the mounting region (21a) of the electrode (21, 22).

According to the construction of the embodiment, the mark (40) for image recognition is made from a resin material.

According to the construction of the embodiment, the electrode (21) includes the base layer (51) and the surface layer (57), the base layer (51) made of a first electrically conductive material and being in contact with the insulating substrate (11), and the surface layer (57) made form a second electrically conductive material and being layered on the base layer (51). The surface layer (57) includes a surface layer mounting portion (57a) structuring the mounting region (21a) of the electrode and a surface layer general portion (57b) structuring the general region (21b) of the electrode (21). A thickness of at least a portion of the surface layer general portion (57b) at the plurality of electrodes (21) is smaller than a thickness of the surface layer mounting portion (57a). The mark (40) for image recognition made from an electrically conductive material whose lightness and saturation are different from lightness and saturation of the second electrically conductive material is formed at a portion with the smaller thickness at the surface layer general portion (57b). A surface of the mark (4) for image recognition and the general region (21b) of the electrode are flushed with each other.

According to the construction of the disclosure, because the mark 40 for image recognition is provided while restraining the reduction of the electrically conductive area, the precision of the image recognition is enhanced and the declination of performance of the thermoelectric module 1, 2 can be restrained.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

The invention claimed is:

1. A thermoelectric module, comprising:
   an insulating substrate;
   a plurality of electrodes formed on a component side of the insulating substrate;
   a plurality of peltier elements each mounted on and electrically connected to the electrodes; and
   a mark for image recognition formed on at least one of the electrodes, the mark for image recognition having lightness and/or saturation which is different from lightness and/or saturation of the electrode on an image; wherein
   an entire of the electrode is usable as an electrical conduction path,
   the mark for image recognition is a plating layer of the at least one of the electrodes,
   the plating layer is an electroless plating film or an electroplating film,
   the electrode includes a fixture side facing the insulating substrate and a component side provided at a reverse side of the fixture side,
   the component side of the electrode includes a mounting region on which the peltier elements are mounted and a general region which is a region other than the mounting region of the electrode,
   the mark for image recognition is formed on the general region of the electrode,
   the mark for image recognition includes a protruding configuration that is formed on at least a portion of the general region of the electrodes, and
   a length of the mark for image recognition from the component side in a thickness direction of the electrode is shorter than a length of the peltier elements from the component side in the thickness direction.

2. The thermoelectric module according to claim 1, wherein
   the mark for image recognition includes a plurality of marks for image recognition and each of the marks for image recognition is formed on the separate electrode.

3. The thermoelectric module according to claim 1, wherein the mark for image recognition is a black nickel plating.

4. The thermoelectric module according to claim 1, wherein an entirety of the mark for image recognition is between the peltier elements.

5. The thermoelectric module according to claim 1, wherein the mark for image recognition is between the peltier elements and extends an entire width of the electrode.

* * * * *